US007639090B2

(12) United States Patent
Lin

(10) Patent No.: US 7,639,090 B2
(45) Date of Patent: *Dec. 29, 2009

(54) PHASE DETECTOR FOR REDUCING NOISE

(75) Inventor: Feng Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/324,077

(22) Filed: Nov. 26, 2008

(65) Prior Publication Data

US 2009/0079485 A1 Mar. 26, 2009

Related U.S. Application Data

(63) Continuation of application No. 11/524,842, filed on Sep. 21, 2006, now Pat. No. 7,463,099, which is a continuation of application No. 10/623,959, filed on Jul. 21, 2003, now Pat. No. 7,129,794.

(51) Int. Cl.
*H03L 7/06* (2006.01)

(52) U.S. Cl. .......................................... 331/25; 327/158

(58) Field of Classification Search .................. 331/25; 327/2, 7, 12, 158
See application file for complete search history.

(56) References Cited

U.S. PATENT DOCUMENTS

| | | | | |
|---|---|---|---|---|
| 5,544,203 | A | 8/1996 | Casasanta et al. | 375/376 |
| 5,642,082 | A | 6/1997 | Jefferson | 331/25 |
| 5,844,954 | A | 12/1998 | Casasanta et al. | 375/373 |
| 5,970,106 | A | 10/1999 | Izumikawa | 375/376 |
| 5,994,934 | A | 11/1999 | Yoshimura et al. | 327/158 |
| 6,154,073 | A | 11/2000 | Choi | 327/161 |
| 6,198,326 | B1 | 3/2001 | Choi et al. | 327/263 |
| 6,377,091 | B1 | 4/2002 | Williams et al. | 327/156 |
| 6,377,092 | B2 | 4/2002 | Ikeda | 327/158 |
| 6,489,823 | B2 | 12/2002 | Iwamoto | 327/158 |
| 6,700,414 | B2 | 3/2004 | Tsujino | 327/3 |
| 6,744,293 | B1 | 6/2004 | Fu et al. | 327/158 |
| 6,779,126 | B1 | 8/2004 | Lin et al. | 713/500 |
| 7,109,807 | B2 | 9/2006 | Lin | 331/25 |
| 7,129,794 | B2 * | 10/2006 | Lin | 331/25 |
| 7,132,898 | B2 | 11/2006 | Lin | 331/25 |
| 7,463,099 | B2 * | 12/2008 | Lin | 331/25 |

* cited by examiner

*Primary Examiner*—Joseph Chang
(74) *Attorney, Agent, or Firm*—Dorsey & Whitney LLP

(57) ABSTRACT

The present invention provides a method and an apparatus for reducing noise. The apparatus includes a phase detector adapted to determine a phase difference between a first and a second signal, a first circuit adapted to generate a control signal based upon the determined phase difference, and a second circuit. The second circuit is adapted to receive a third signal, receive a fourth signal, modify the fourth signal based upon the control signal, and provide the third signal and the modified fourth signal to the phase detector as the first and second signals.

12 Claims, 5 Drawing Sheets

115
ADJUSTABLE DELAY 220
225(2) 225(1) 225(3) 225(n)
CLKIN
DELAY 230
CLKOUT
PHASE DETECTOR 200
SL SR
CONTROL LOGIC 210
215
FEEDBACK

PHASE DETECTOR 200
CLKIN FEEDBACK
HYSTERESIS ADJUSTER 300
CLKIN' FEEDBACK'
PHASE DETECTOR CORE 310
UP DN
DIGITAL FILTER 320
SL SR
CONTROL

PHASE DETECTOR FOR REDUCING NOISE

CROSS-REFERENCE TO RELATED APPLICATIONS

This application is a continuation of U.S. patent application Ser. No. 11/524,842, filed Sep. 21, 2006, U.S. Pat. No. 7,436,099, which is a continuation of U.S. patent application Ser. No. 10/623,959, filed Jul. 21, 2003, U.S. Pat. No. 7,129,794. These applications are incorporated by reference herein.

BACKGROUND OF THE INVENTION

1. Field of the Invention

This invention relates generally to the synchronization of periodic signals, such as clock signals. More particularly, the invention relates to a phase detector for reducing noise.

2. Description of the Related Art

Many high speed electronic systems possess critical timing requirements that dictate the need to generate a periodic clock waveform possessing a precise timing relationship with respect to some reference signal. The improved performance of computing integrated circuits and the growing trend to include several computing devices on the same board present a challenge with respect to synchronizing the time frames of all the components.

While the operation of various components in the system should be highly synchronized, i.e., the maximum skew in time between the significant edges of the internally generated clocks of the components should be minimized, it is not enough to feed the reference clock of the system to these components. This is because different chips may have different manufacturing parameters, which, when taken together with additional factors such as ambient temperature, voltage, and processing variations, may lead to large differences in the phases of the respective chip generated clocks. Conventionally, synchronization is achieved by using digital delay locked loop (DDLL) circuits to detect the phase difference between clock signals of the same frequency and produce a digital signal related to the phase difference. By feeding back the phase difference-related signal to control a delay line, the timing of one clock signal is advanced or delayed until its rising edge is coincident with the rising edge of a second clock signal.

The phase differences are typically detected by a phase detector included in the digital delay locked loop circuit. The phase detector compares an input, or reference, signal to a feedback signal and then generates a signal proportional to the phase difference between the reference and feedback signals. The signal proportional to the phase difference is then provided to a so-called "delay line" that may introduce a variable delay into the delay path of the input signal. Conventional digital delay lines include a number of discrete delay elements, each of which may be capable of introducing a single unit delay into the delay path. For example, a conventional delay element may be an inverter that introduces a unit delay of about 200 picoseconds into the delay path. Thus, the phase detector signal typically corresponds to a series of "up" and "down" signals that indicate that a delay element should be introduced into, or removed from, the delay path, respectively.

When the phase difference between the input signal and the reference signal becomes close to, or less than, one unit delay, conventional phase detectors generate a series of alternating "up" and "down" signals. If several clock cycles are required for a signal to propagate through the delay path and feedback to the phase detector, the series of adjustments indicated by the alternating "up" and "down" signals may create noise that may cause loop stability problems in the digital delay locked loop. The series of adjustments performed in response to the alternating signals may also cause the phase of the output clock signal to advance and retreat on successive clock cycles, creating noise, such as jitter, in the output clock signal. Noise in the output clock signal may reduce the stability of, or cause an error in, the digital device relying on the output clock.

SUMMARY OF THE INVENTION

In one aspect of the instant invention, an apparatus is provided for reducing noise. The apparatus includes a phase detector adapted to determine a phase difference between a first and a second signal, a first circuit adapted to generate a control signal based upon the determined phase difference, and a second circuit. The second circuit is adapted to receive a third signal, receive a fourth signal, modify the fourth signal based upon the control signal, and provide the third signal and the modified fourth signal to the phase detector as the first and second signals.

In another aspect of the present invention, a method is provided for reducing noise. The method includes receiving a clock signal, receiving a feedback signal formed using the clock signal, generating a control signal indicative of a phase difference between the clock signal and the feedback signal, and modifying the feedback signal based upon the control signal.

In another aspect of the instant invention, a delay locked loop is provided. The delay locked loop includes an adjustable delay element adapted to receive an input clock signal and provide an output clock signal, a control logic coupled to the adjustable delay element, and a phase detector communicatively coupled to the control logic. The phase detector is adapted to determine a phase difference between the input clock signal and the output clock signal and includes a hysteresis adjuster adapted to provide a modified output clock signal based upon the output clock signal and a control signal, a phase detector core adapted to determine a phase difference between the input clock signal and the modified output clock signal, and a digital filter adapted to provide the control signal to the hysteresis adjuster based upon the phase difference.

BRIEF DESCRIPTION OF THE DRAWINGS

The invention may be understood by reference to the following description taken in conjunction with the accompanying drawings, in which like reference numerals identify like elements, and in which.

Figure 1:
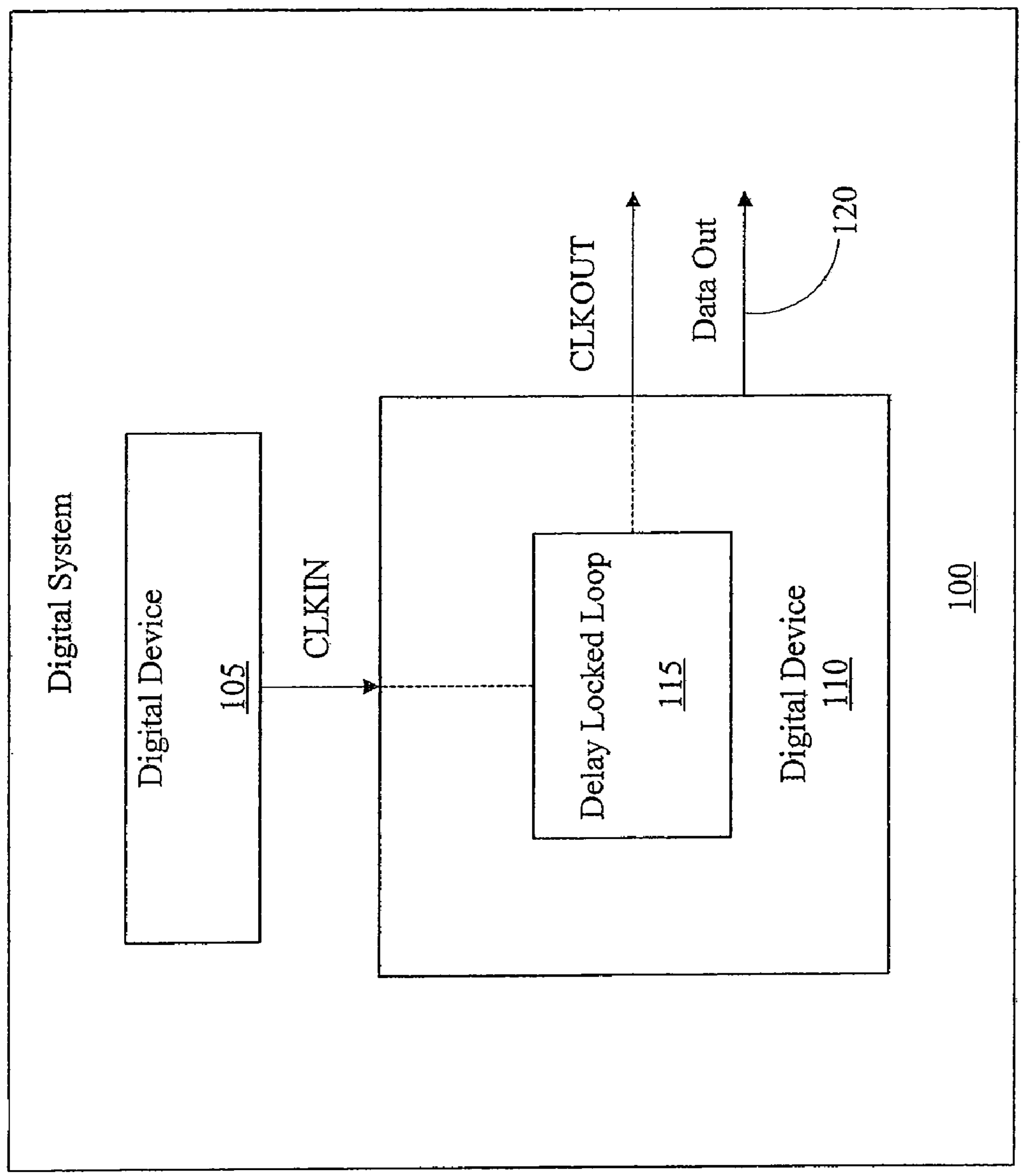
FIG. 1 is a simplified block diagram of a digital system having a delay locked loop circuit.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

FIG. 1 shows a simplified block diagram of a digital system 100. The digital system 100 includes a digital device 105 coupled to a second digital device 110. The digital device 105 provides a reference clock signal (CLKIN) to the second digital device 110. The second digital device 110 uses the CLKIN signal to synchronize its internal clocks using a delay locked loop 115 and generate an output clock signal (CLKOUT). As an illustrative example, the second digital device 110 may be a memory device that synchronizes its output data on a data line 120 with the CLKOUT signal. Although the present invention will be described in the context of the delay locked loop 115, persons of ordinary skill in the art will appreciate that the present invention may be used in other loops, including phase locked loops and the like.

Figure 2:
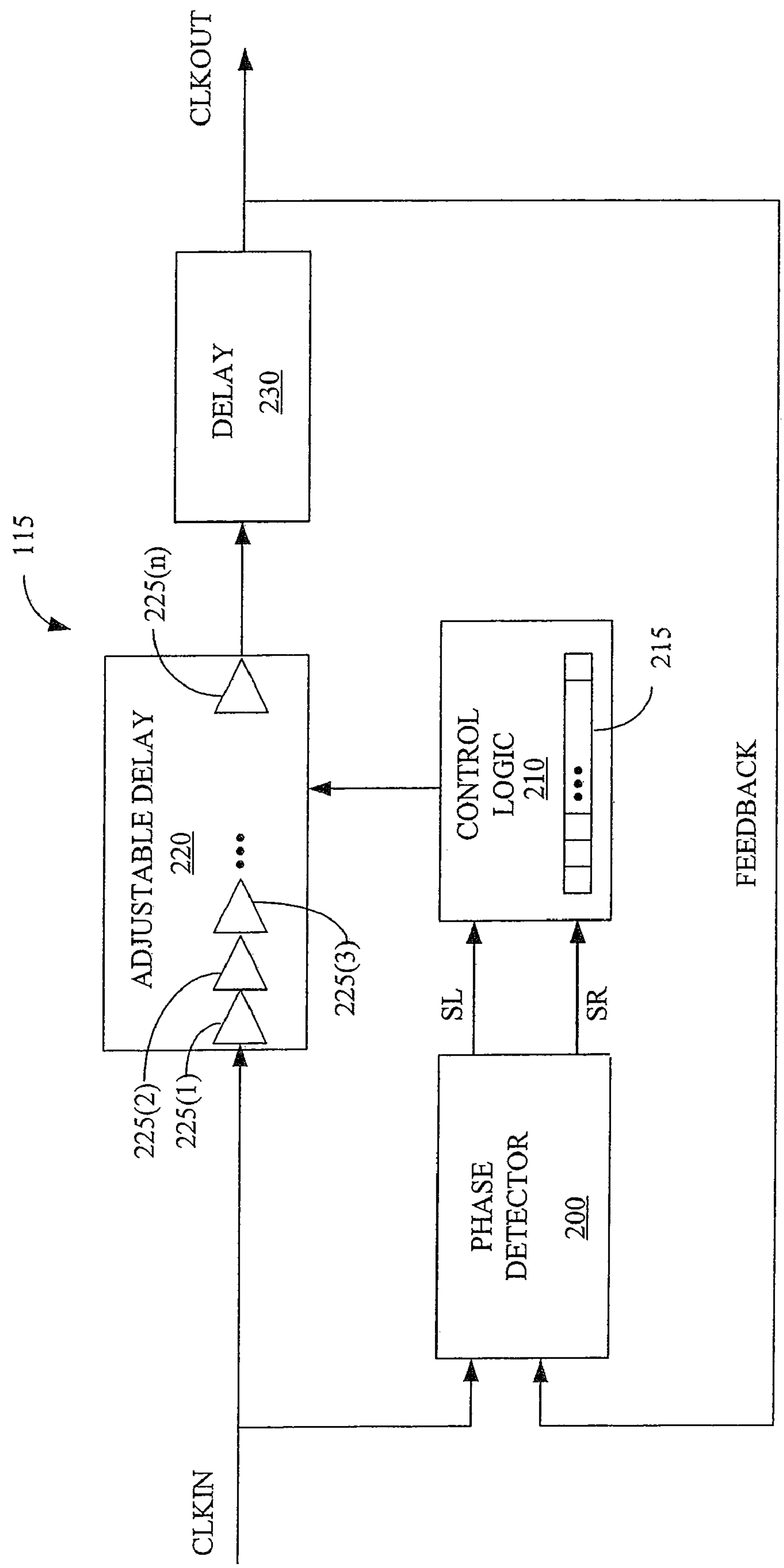
FIG. 2 shows one embodiment of a delay locked loop circuit that may be used in the digital system shown in FIG. 1.

FIG. 2 illustrates one embodiment of the delay locked loop 115 that receives the CLKIN signal and provides the CLKOUT signal. In the illustrated embodiment, the CLKIN signal and a FEEDBACK signal are provided to a phase detector 200, which may determine a phase difference between the CLKIN signal and the FEEDBACK signal. In one embodiment, the FEEDBACK signal is approximately equal to the CLKOUT signal. However, the present invention is not so limited. In one alternative embodiment, additional delays, such as input/output delays and the like, may cause the FEEDBACK signal and the CLKOUT signal to have a different phase.

The phase detector 200 provides one or more signals indicative of the phase difference between the CLKIN signal and the FEEDBACK signal to a control logic 210. In the illustrated embodiment, the phase detector 200 provides a binary output based on the relative phase difference between the CLKIN and FEEDBACK signals. For example, the phase detector 200 may provide a shift-left signal (SL) if the FEEDBACK signal leads the CLKIN signal and a shift-right signal (SR) if the FEEDBACK signal lags the CLKIN signal.

In the illustrated embodiment, the control logic 210 includes a shift register 215 that may receive the shift-left signal (SL) or the shift-right signal (SR). However, it will be appreciated by those of ordinary skill in the art that the shift register 215 is not necessary for the practice of the present invention, and thus the control logic 210 may not include the shift register 215. Furthermore, the present invention is not limited to phase detectors 200 that provide binary output. In various alternative embodiments, the phase detector 200 may provide any desirable signal to indicate the relative phase difference between the CLKIN and the FEEDBACK signals.

The CLKIN signal is also provided to an adjustable delay 220 in the delay locked loop 115. In one embodiment, the adjustable delay 220 includes a plurality of delay elements 225(1-n). However, the number of delay elements 225(1-n) is a matter of design choice and thus, unless expressly set forth in the claims, the present invention is not limited to any specific number of delay elements 225(1-n). Each of the delay elements 225(1-n) may be capable of introducing a unit time delay into the CLKIN signal. For example, the delay elements 225(1-n) may each be a digital device, such as a NAND gate (not shown) and the like, that may introduce a unit time delay of about 200 picoseconds into the CLKIN signal. However, it will be appreciated by those of ordinary skill in the art that, in alternative embodiments, the delay elements 225(1-n) may not be digital devices. Furthermore, the adjustable delay 220 may not be formed of a plurality of separate delay elements 225(1-n). For example, in various alternative embodiments, the adjustable delay 220 may include one or more analog devices capable of introducing a variable time delay into the CLKIN signal.

The delay locked loop 115 may also include a delay 230. For the sake of clarity, the delay 230 is represented in FIG. 2 as a single element coupled to the adjustable delay 220. However, those of ordinary skill in the art will appreciate that the delay 230 may not be a single element. In particular, the delay 230 is intended to be representative of the various delays, such as clock distribution delays and the like, that may be introduced into the CLKIN signal by the devices and lines within the delay locked loop 115. For example, the delay locked loop 115 may have an intrinsic delay, represented in FIG. 2 as the delay 230, ranging from about 1 clock cycle to up to about 8 clock cycles, depending on the process, the voltage, the period of the CLKIN signal and/or the temperature. However, as mentioned above, the delay 230 may or may not include additional delays, such as input and/or output delays, which may affect the CLKIN and CLKOUT signals.

The control logic 210 is coupled to the adjustable delay 220. In the illustrated embodiment, the control logic 210, may provide a signal to the adjustable delay 220 that may be used to select one or more of the delay elements 225(1-n). An adjustable delay 220 may be introduced into the CLKIN signal by providing the CLKIN signal to the one or more selected delay elements 225(1-n). In one embodiment, the control logic 210 may select one or more of the delay elements 225(1-n) to compensate for the delay 230 such that the CLKIN signal is approximately in phase with the CLKOUT signal. For example, if the delay locked loop 115, has an intrinsic delay of about 3.5 nanoseconds and the period of the CLKIN signal is about 5 nanoseconds, then seven delay elements 225(1-n), each having a unit time delay of about 200 picoseconds, may be selected by the control logic 210. In the illustrated embodiment, the control logic 210 may select the one or more delay elements 225(1-n) using information stored in the shift register 215. However, as discussed above, the shift register 215 is not necessary for the practice of the present invention.

Figure 3:
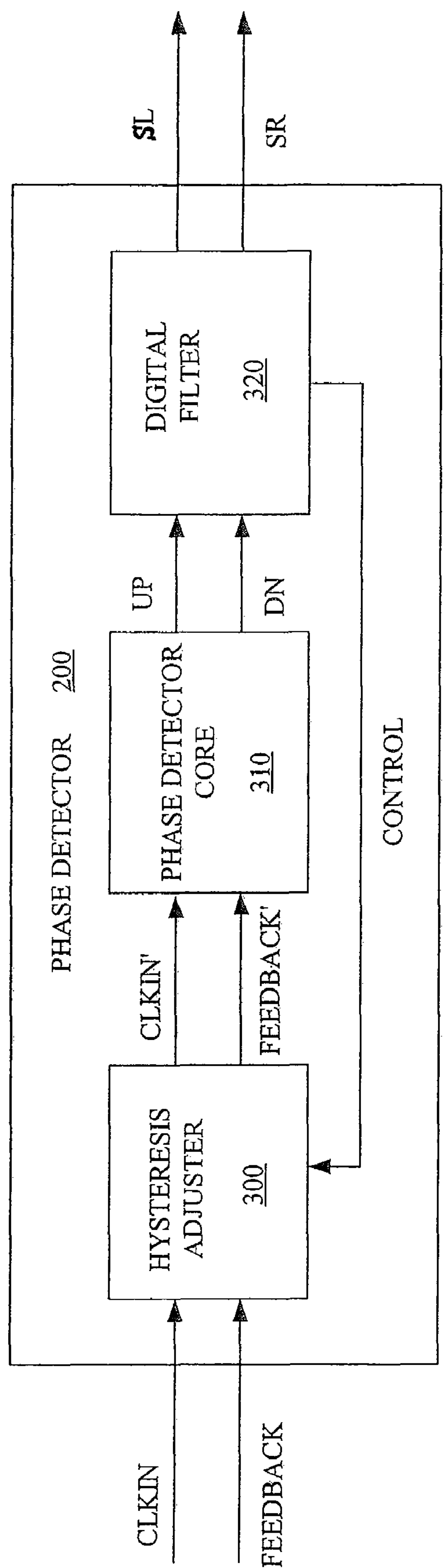
FIG. 3 shows one embodiment of a phase detector that may be used in the delay locked loop circuit shown in FIG. 2.

The phase detector 200 may detect a phase difference between the CLKIN signal and the FEEDBACK signal that is less than about one unit time delay, which may result in the phase detector 200 providing an adjustment signal, such as a shift-left signal (SL) and/or a shift-right signal (SR), to the control logic 210. The adjustable delay 220 may over-adjust the CLKIN signal by introducing a time delay of at least one unit time delay into the CLKIN signal. The over-adjusted CLKIN signal may be provided to the phase detector 200 via the FEEDBACK path, which may detect the new phase difference between the CLKIN signal and the FEEDBACK signal and provide a compensating adjustment signal to the control logic 210. However, the FEEDBACK signal may be delayed by approximately the delay 230. Thus, to reduce the number of undesirable adjustment signals that may be provided to the control logic 210, and thereby reduce noise and improve the loop stability of the delay locked loop 115, a CONTROL signal may be used in one embodiment of the phase detector 200, as illustrated in FIG. 3.

In the illustrated embodiment, the phase detector 200 includes a hysteresis adjuster 300, a phase detector core 310, and a digital filter 320. The hysteresis adjuster 300, which is described in detail below, receives the CLKIN signal and the FEEDBACK signal and provides modified signals, CLKIN' and FEEDBACK', to the phase detector core 310. In one embodiment, the phase detector core 310 may be a latch-type phase detector. However, the specific type of phase detector core 310 is a matter of design choice and therefore the present invention is not limited to latch-type phase detectors. In various alternative embodiments, any desirable type of phase detector 200, including arbiter-type phase detectors, counter-type phase detectors, and the like, may be used to form the phase detector core 310.

The phase detector core 310 generates a signal that is indicative of the phase difference between the CLKIN' signal and the FEEDBACK' signal. In the illustrated embodiment, the phase detector core 310 generates an UP signal to indicate that the CLKIN' signal leads the FEEDBACK' signal and a DOWN signal to indicate that the CLKIN' signal lags the FEEDBACK' signal. The phase detector core 310 provides the UP and DOWN signal to the digital filter 320, which may use the UP and DOWN signals to respectively generate the shift-left signal (SL) and the shift-right signal (SR). In one embodiment, the digital filter 320 may, be a majority filter that may provide a signal in response to detecting at least two consecutive determined phase differences in the same direction. For example, the digital filter 320 may provide a shift-left signal (SL) in response to receiving two consecutive UP signals and a shift-right signal (SR) in response to receiving two consecutive DOWN signals. However, those of ordinary skill in the art will appreciate that, in alternative embodiments, the digital filter 320 may provide the shift-right signal (SR) and/or the shift-left signal (SL) in response to receiving any desirable sequence of UP and/or DOWN signals.

The digital filter 320 also provides a CONTROL signal to the hysteresis adjuster 300. In one embodiment, the CONTROL signal is not filtered by the digital filter 320. For example, the CONTROL signal may correspond to the UP and/or DOWN signals provided to the digital filter 320 by the phase detector core 310. However, in alternative embodiments, the CONTROL signal may be any desirable signal provided by the digital filter 320. The hysteresis adjuster 300 may provide modified signals, CLKIN' and FEEDBACK', in response to receiving the CONTROL signal, as described below.

Figure 4:
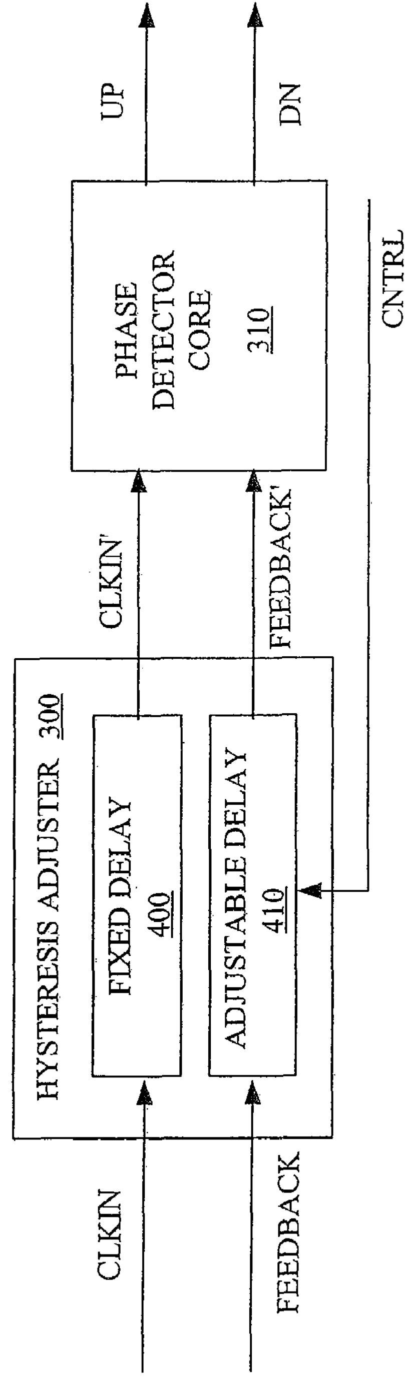
FIG. 4 shows one embodiment of a hysteresis adjuster that may be used in the phase detector shown in FIG. 3.

FIG. 4 shows one embodiment of the hysteresis adjuster 300, which includes a fixed delay 400 and an adjustable delay 410. In one embodiment, the fixed delay 400 forms the CLKIN' signal by introducing a predetermined time delay into the CLKIN signal. For example, the fixed delay 400 may include two delay elements (not shown) to introduce a predetermined time delay of about two unit delays into the CLKIN signal. However, as will be appreciated by those of ordinary skill in the art, the predetermined time delay is not material to the present invention. In various alternative embodiments, any desirable delay may be introduced into the CLKIN signal by the fixed delay 400.

The adjustable delay 410 may introduce a selected time delay into the FEEDBACK signal to form the FEEDBACK' signal. In one embodiment, the time delay is selected in response to receiving the CONTROL signal. If the CONTROL signal corresponds to the DOWN signal, the selected time delay may be larger than the time delay introduced by the fixed delay 400. For example, if the fixed delay 400 introduced a time delay of about two unit delays, the adjustable delay 410 may introduce a selected time delay of about three unit delays into the FEEDBACK signal. If the CONTROL signal corresponds to the UP signal, a selected time delay may be about equal to the time delay introduced by the fixed delay 400. For example, if the fixed delay 400 introduced a time delay of about two unit delays, the adjustable delay 410 may also introduce a selected time delay of about two unit delays into the FEEDBACK signal.

To illustrate the operation of the phase detector 200, consider the following example. Initially, the CLKIN signal is assumed to lag the FEEDBACK signal by less than about one unit time delay. The fixed delay 400 and the adjustable delay 410 are further assumed to introduce equal time delays into the CLKIN signal and the FEEDBACK signal, respectively. Thus, the CLKIN' signal initially lags the FEEDBACK' signal by less than about one unit time delay. The phase detector core 310 then determines that the CLKIN' signal lags the FEEDBACK' signal and provides a DOWN signal to the digital filter 320. As discussed above, in this embodiment, the digital filter 320 is a majority filter. Assuming that this is the first DOWN signal received by digital filter 320, no shift-left signal (SL) or shift-right signal (SR) is provided by the digital filter 320, and the adjustable delay 220 shown in FIG. 2 remains unchanged.

The digital filter 320 also provides the CONTROL signal indicative of the DOWN signal to the hysteresis adjuster 300. In response to receiving the CONTROL signal indicative of the DOWN signal, the adjustable delay 410 introduces a delay into the FEEDBACK signal that is larger than the delay introduced into the CLKIN signal by the fixed delay 400. For example, if the delay introduced by the fixed delay 400 is approximately two unit delays, then the adjustable delay 410 will introduce a delay of approximately three unit delays in response to receiving the CONTROL signal indicative of the DOWN signal.

The delay introduced by the adjustable delay 410 results in the CLKIN' signal leading the FEEDBACK' signal by less than about one time delay unit during the next clock cycle, assuming that the phase difference between the CLKIN signal and the FEEDBACK signal remained approximately constant. Thus, the phase detector core 310 provides an UP signal to the digital filter 320. Since the previous signal received by the digital filter 320 was a DOWN signal, no shift-left signal (SL) or shift-right signal (SR) is provided by the digital filter 320, and the adjustable delay 220 shown in FIG. 2 remains unchanged.

In response to receiving the CONTROL signal indicative of the UP signal, the adjustable delay 410 reduces the delay introduced into the FEEDBACK signal so that is about equal to the delay introduced into the CLKIN signal by the fixed delay 400. For example, if the delay introduced by the fixed delay 400 is approximately two unit delays, then the adjustable delay 410 will introduce a delay of approximately two unit delays in response to receiving the CONTROL signal indicative of the UP signal. Consequently, the CLKIN' signal will now lag the FEEDBACK' signal by less than one time delay unit during the next clock cycle, assuming that the phase difference between the CLKIN signal and the FEEDBACK signal remained approximately constant.

As illustrated by the previous example, differences between the CLKIN signal and the FEEDBACK signal that are less than about one unit time delay may not result in a shift-left signal (SL) or a shift-right signal (SR) being provided by the digital filter 320, so that the adjustable delay 220 shown in FIG. 2 remains unchanged. The loop stability of the phase detector 200 may therefore be increased by including the hysteresis adjuster 300, the phase detector core 310, and the digital filter 320. Furthermore, by increasing the loop stability of the phase detector 200 in the manner described above, undesirable jitter in the output clock signal may be reduced, thereby increasing the stability of the digital devices 105, 110 relying on the output clock and reducing errors that may be caused by jitter of the output clock signal.

Figure 5A:
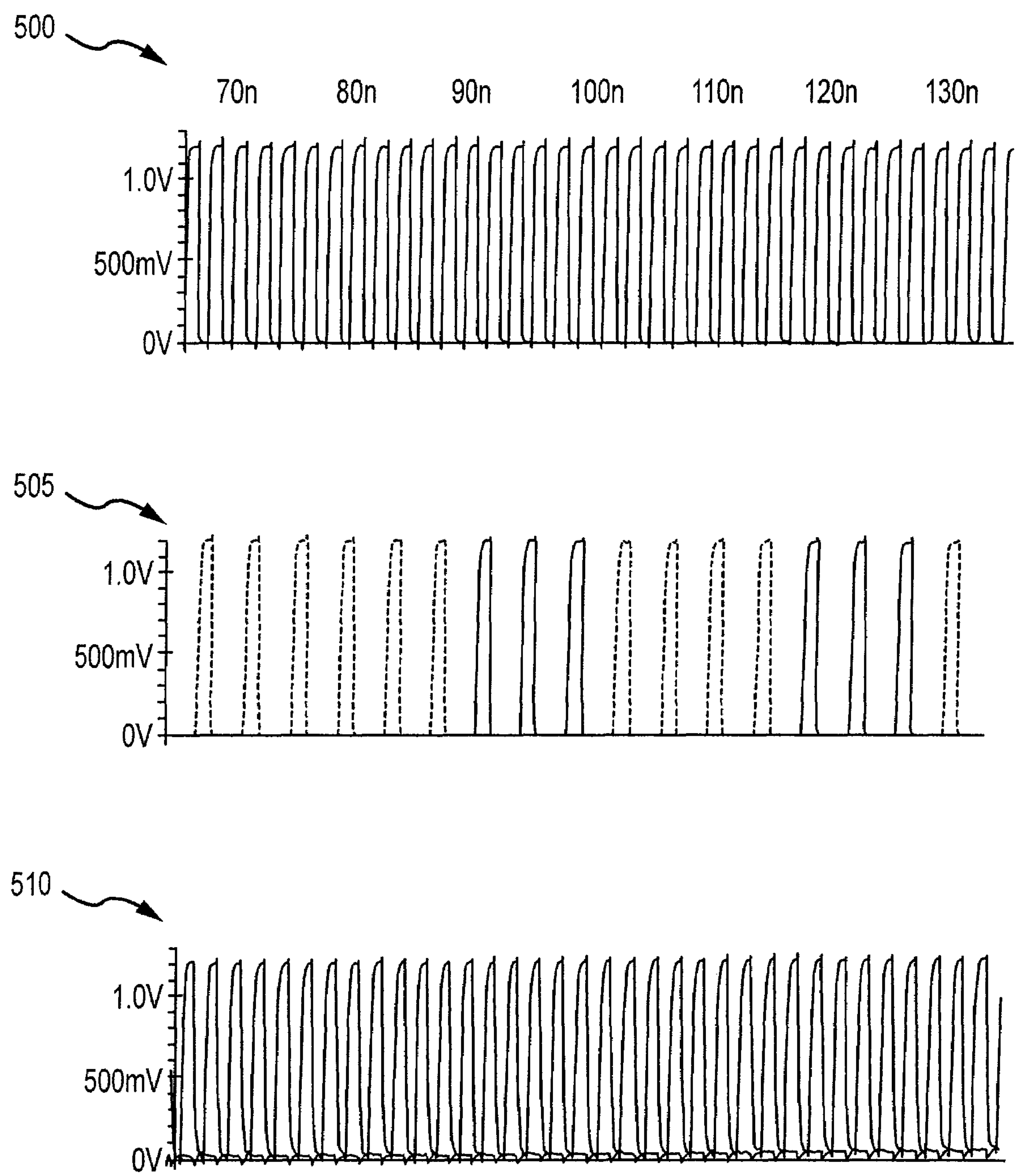
FIGS. 5A and 5B show simulated input and output signals for a phase detector without a hysteresis adjuster and with a hysteresis adjuster, respectively.
Figure 5B:
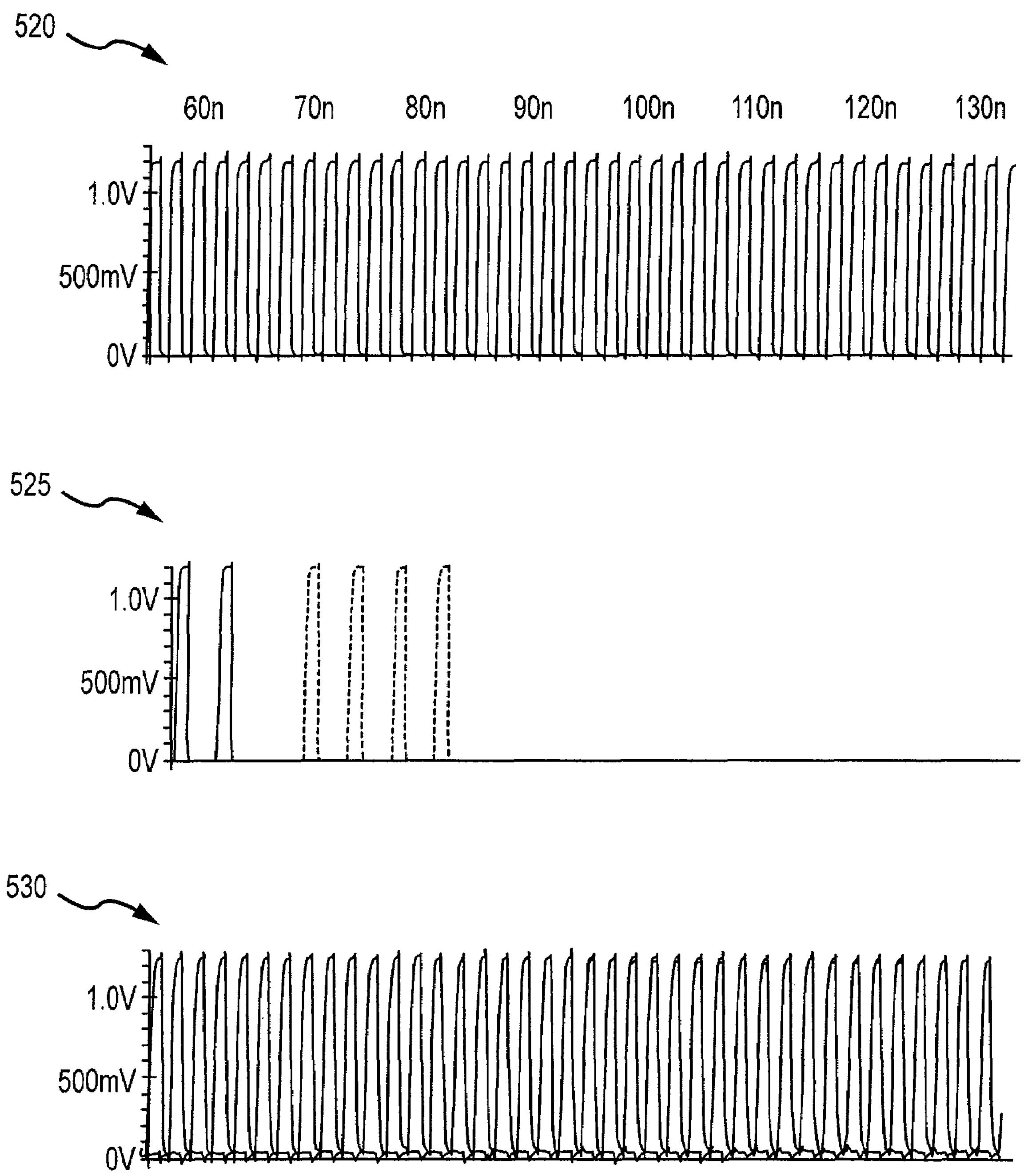

Illustrative input and output signals for two embodiments of the phase detector 200 are shown in FIGS. 5A and 5B. It will be appreciated by those of ordinary skill in the art that the illustrated signals are exemplary in nature and are not intended to limit the present invention. FIG. 5A shows two simulated input signals 500 having a small phase difference. It will be appreciated that the coarse resolution of FIG. 5A, and the small phase difference between the two input signals 500, causes the two input signals 500 to blend together so that they appear as a single line. FIG. 5A also shows a simulated output signal 505 for a phase detector, such as the phase detector 200 shown in FIG. 2, without a hysteresis adjuster 300 or a filter, such as the hysteresis adjuster 300 and the digital filter 320 shown in FIG. 3. A simulated output signal 510 for a phase detector core, such as the phase detector core 310 shown in FIG. 3, is also shown in FIG. 5A.

FIG. 5B shows two simulated input signals 520 having a small phase difference. It will be appreciated that the coarse resolution of FIG. 5B, and the small phase difference between the two input signals 520, causes the two input signals 520 to blend together so that they appear as a single line. FIG. 5B also shows a simulated output signal 525 for a phase detector, such as the phase detector 200 shown in FIG. 2, having a hysteresis adjuster and a filter, such as the hysteresis adjuster 300 and the digital filter 320 shown in FIG. 3. A simulated output signal 530 for a phase detector core, such as the phase detector core 310 shown in FIG. 3, is also shown.

By comparing the simulated signals shown in FIGS. 5A and 5B, persons of ordinary skill in the art will appreciate that undesirable jitter in the simulated output signal 505 produced by the phase detector 200 that does not include a hysteresis adjuster 300 and a filter 320 is reduced in the simulated output signal 525 produced by the phase detector 200 having the hysteresis adjuster 300 and the filter 320.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An delay-lock loop, comprising:

a delay circuit coupled to receive an input clock signal, the delay circuit structured to delay the input clock signal by a delay determined by a delay control signal to provide a delayed clock signal;

a phase detector receiving at least two input signals, the phase detector being structured to determine a phase difference between the at least two input signals and generate at least one output signal based on the determined phase difference, the at least one output signal being used to generate the delay control signal;

a first circuit coupled to receive the at least one output signal from the phase detector, the first circuit being structured to generate a first control signal based upon the at least one output signal; and a second circuit coupled to receive the input clock signal, the delayed clock signal, and the first control signal, the second circuit being structured to modify at least one of the input clock signal and the delayed clock signal based upon the first control signal to provide a modified signal, the second circuit being structured to provide the modified signal and at least one signal to the phase detector as the at least two input signals to the phase detector, the at least one signal provided to the phase detector being based on at least one of the input clock signal and the delayed clock signal.

2. The delay-lock loop of claim 1 wherein the second circuit is structured to modify the delayed clock signal before providing the modified delayed clock signal to the phase detector.

3. The delay-lock loop of claim 1 wherein the second circuit is structured to modify to modify both the input clock signal and the delayed clock signal and to provide the modified input clock signal and the modified delayed clock signal to the phase detector as the at least two input signals to the phase detector.

4. The delay-lock loop of claim 1 wherein the second circuit comprises a fixed delay circuit and an adjustable delay circuit.

5. The delay-lock loop of claim 1 wherein the phase detector comprises at least one of a latch-type detector, an arbiter-type detector, and a counter-type detector.

6. The delay-lock loop of claim 1 wherein the second circuit comprises a hysteresis adjuster.

7. A delay-lock loop, comprising:

a delay circuit coupled to receive an input clock signal, the delay circuit structured to delay the input clock signal by a delay determined by a delay control signal to provide a delayed clock signal;

a hysteresis circuit coupled to receive the input clock signal and the delayed clock signal, the hysteresis circuit being structured to modify at least one of the input clock signal and the delayed clock signal based upon a phase difference signal to provide a modified signal; and a phase detector coupled to receive the modified signal from the hysteresis circuit and to receive a signal based on at least one of the input clock signal and the delayed clock signal, the phase detector being structured to determine a difference between a phase of the modified signal and a phase of the signal based on at least one of the input clock signal and the delayed clock signal, the phase detector being structured to provide the difference signal and the delay control signal based on the determined phase difference.

8. The delay-lock loop of claim 7 wherein the hysteresis circuit is structured to modify the delayed clock signal and to then provide the modified delayed clock signal to the phase detector.

9. The delay-lock loop of claim 7 wherein the hysteresis circuit comprises a fixed delay and an adjustable delay.

10. The delay-lock loop of claim 9 wherein the adjustable delay comprises at least two delay elements, at least one of the delay elements in the adjustable delay being selectable based upon the phase difference signal.

11. The delay-lock loop of claim 7, further comprising a majority filter structured to provide a signal indicative of the desired clock signal delay in response to at least two consecutive difference signals having the same polarity.

12. The difference signal of claim 7 wherein the phase detector comprises at least one of a latch-type detector, an arbiter-type detector, and a counter-type detector.

* * * * *

UNITED STATES PATENT AND TRADEMARK OFFICE

CERTIFICATE OF CORRECTION

PATENT NO. : 7,639,090 B2
APPLICATION NO. : 12/324077
DATED : December 29, 2009
INVENTOR(S) : Feng Lin It is certified that error appears in the above-identified patent and that said Letters Patent is hereby corrected as shown below:

In column 1, line 8, delete "7,436,099," and insert -- 7,463,099, --, therefor.

In column 8, line 12, in Claim 3, after "to modify" delete "to modify".

Signed and Sealed this

Twenty-third Day of March, 2010

David J. Kappos
*Director of the United States Patent and Trademark Office*